United States Patent [19]

Johnson

[11] 4,268,763
[45] May 19, 1981

[54] CONDITIONING CIRCUIT FOR USE WITH I²L AND ISL LOGIC ARRAYS EMBODYING TWO POWER SUPPLIES

[75] Inventor: Stephen C. Johnson, Redwood City, Calif.

[73] Assignee: Signetics Corporation, Sunnyvale, Calif.

[21] Appl. No.: 27,434

[22] Filed: Apr. 5, 1979

[51] Int. Cl.³ .......................... H03K 3/01; H03K 5/13
[52] U.S. Cl. ............................... 307/605; 307/296 A; 307/254; 307/DIG. 1; 328/48
[58] Field of Search ......... 307/DIG. 1, 200 A, 200 B, 307/296, 293, 247; 357/52; 328/48

[56] References Cited

U.S. PATENT DOCUMENTS

| | | | |
|---|---|---|---|
| 3,560,767 | 2/1971 | Traub | 307/293 |
| 3,703,648 | 11/1972 | Wrabel | 307/293 |
| 3,732,442 | 5/1973 | Husbands et al. | 307/296 |
| 4,001,609 | 1/1977 | Sickert | 328/48 |
| 4,013,902 | 3/1977 | Payne | 328/48 |
| 4,045,688 | 8/1977 | Stewart | 307/200 B |
| 4,103,187 | 7/1978 | Imamura | 307/200 B |
| 4,155,014 | 5/1979 | Tung | 357/92 |

OTHER PUBLICATIONS

Hanchett, "Turn-On Reset Circuits", RCA Tech. Nte. TN No. 927, 3/28/73, 4 pp.

Primary Examiner—Stanley D. Miller, Jr.
Assistant Examiner—B. P. Davis
Attorney, Agent, or Firm—Jerry A. Dinardo; William H. Dana; Jack Oisher

[57] ABSTRACT

Two independent power supplies for an I²L or ISL logic array can be timed to turn on at different times by a simple RC network connected externally of the logic array. The differential timing is utilized to condition or set a bistable device in a predetermined initial desired state, without requiring an additional device terminal pin for that purpose.

7 Claims, 7 Drawing Figures

CONDITIONING CIRCUIT FOR USE WITH I²L AND ISL LOGIC ARRAYS EMBODYING TWO POWER SUPPLIES

BACKGROUND OF THE INVENTION

This invention relates to a circuit for initializing internal flip-flops, latches or other storage elements in I²L (integrated injection logic) or ISL (injected Schottky logic) logic arrays during power up without the need for providing an extra device pin for that purpose.

In turning on power to a logic circuit which can assume one of two bistable states, it is desirable to have the circuit assume a predetermined one of the two bistable logic states. For example, it may be desired that a certain bistable element first assume a low state every time the power is turned on rather than leave it to chance that the bistable element will assume the desired low state or the undesired high state. In that case a special conditioning circuit and an extra device pin is required to place the bistable element in its initial desired state.

SUMMARY OF THE INVENTION

This invention is based in part on the recognition that logic arrays frequently operate with two independent power supplies, and that the timing of "turning on" each supply can be controlled externally of the logic array integrated circuit by a simple RC network that is connected to the device pins in such a way that one power supply is delayed relative to the other one. In this context, a device pin is an external electrode forming a part of an integrated circuit package, or integrated circuit device, which is normally used to make electrical connection with circuitry internally of the integrated circuit package. The differential timing of the two power supply voltages permits certain portions of the logic array to be initially biased in a known state by one power supply that comes on first, while the other power supply is delayed from reaching its effective bias operating level.

In a specific embodiment of the invention, a gate array includes a Schottky NPN transistor that is supplied power from a first power source that turns on first, and the array also includes an input I²L gate and a pair of cascaded output I²L gates that are supplied power from a second power source. The gate array functions to provide a logic signal which initially places a given latch in the reset state.

DETAILED DESCRIPTION OF THE PREFERRED EMBODIMENT

Figures 1, 2:
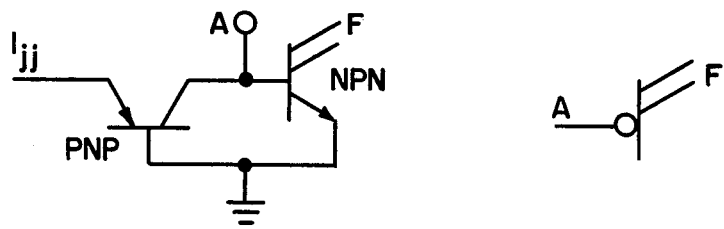
FIG. 1 is a schematic diagram of an I²L gate.
FIG. 2 is a symbolic or simplified representation of the I²L gate of FIG. 1.

FIG. 1 is a schematic representation of an I²L gate. A current source $I_{jj}$ is connected to the emitter of a PNP transistor. The current $I_{jj}$ may be supplied from a voltage source which is hereinafter referred to as $V_{jj}$. The base of the PNP transistor is connected to ground and to the emitter of an NPN transistor. The collector of the PNP transistor and the base of the NPN transistor are connected together and to an input terminal A. One or more outputs F may be taken from the collector or collectors of the NPN transistor.

FIG. 2 is a shorthand or simplified representation of the I²L gate of FIG. 1. The current source $I_{jj}$, the PNP transistor, and associated connection, and the emitter of the NPN transistor connected to ground are all implied in the shorthand representation of FIG. 2.

Figures 3, 4:
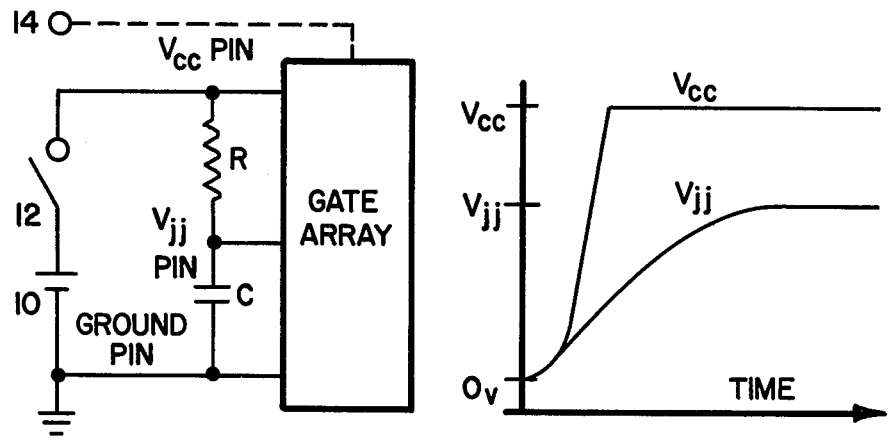
FIG. 3 is a schematic diagram illustrating a circuit according to the invention for applying two time delayed voltage supplies to a gate array.
FIG. 4 is a graph of wave forms showing the operation of the circuit of FIG. 3.

FIG. 3 shows diagrammatically the external circuitry of the invention connected to the device pins of an I²L gate array. Three device pins are shown. A $V_{cc}$ pin supplies power to a Schottky TTL transistor, not shown. A $V_{jj}$ pin supplies power to the I²L gates, not shown, and the third pin is a ground connection or ground pin. The negative side of a voltage source 10 is connected to the ground pin, and the positive side of the source 10 is connected through a switch 12 to the $V_{cc}$ pin. A resistor R is connected between the $V_{jj}$ pin and the $V_{cc}$ pin. A capacitor C is connected between the $V_{jj}$ pin and the ground pin.

A phantom connection is shown between an external pin 14 and the gate array. The phantom connection to the pin 14 is shown to indicate that, in the absence of the circuit according to the invention, the external pin 14 would be required to furnish a predetermined signal to the gate array for setting a latch in a given state, for example, when the power to the gate array is turned on.

When the switch 12 is closed, the voltage at the $V_{cc}$ pin rises quickly to the value of the voltage of the source 10. However, the voltage of the $V_{jj}$ pin will rise from zero to its steady value in a manner consistent with the time constant of the resistance R and the capacitance C. The voltage relationships are shown in FIG. 4. It is seen that the $V_{cc}$ voltage rises rather abruptly to its steady state value, for example 5.0 volts, whereas the $V_{jj}$ voltage slowly rises to its ultimate value, for example 1.5 volts.

Figure 5:
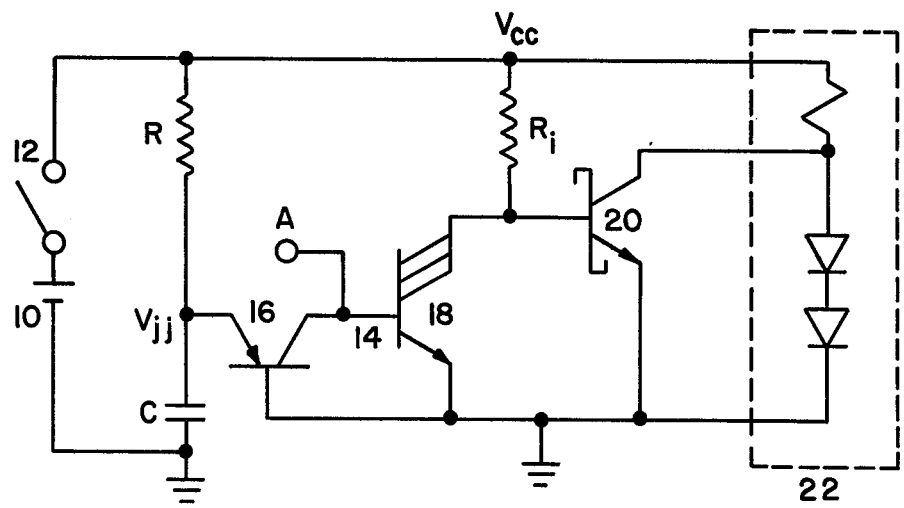
FIG. 5 is a schematic diagram of a circuit according to the invention for powering a gate array including an I²L input gate and a Schottky TTL output gate.

The value of resistor R is determined by the steady state current required by the gate array at the $V_{jj}$ pin. The value of the capacitor C selected depends upon the desired time constant. A practical application might use a 30 ohm resistor and a 30 microfarad capacitor. FIG. 5 shows how the internal circuitry of an I²L gate array may be utilized to take advantage of the differential timing of the $V_{cc}$ and $V_{jj}$ voltages. The voltage source 10 is connected through the switch 12 to the $V_{cc}$ pin. The resistor R and capacitor C are connected to the $V_{cc}$ pin, the $V_{jj}$ pin, and the ground pin as described previously in connection with FIG. 3.

An I²L gate 14 includes a PNP transistor 16 and an NPN transistor 18 coupled together. The emitter of the PNP transistor 16 is connected to the $V_{jj}$ pin. The base of the transistor 16 is connected to the emitter of the transistor 18 and to ground. The collector of the transistor 16 is connected to the base of the transistor 18 and to an input terminal A, which is left open or floating when the power is turned on. The transistor 18 is shown with three collectors connected together and to the base of a Schottky-clamped transistor 20. The Schottky-clamped transistor 20 is shown as being of the NPN type and has its base connected through a biasing resistor $R_i$ to the $V_{cc}$ supply. The emitter of the Schottky-clamped transistor 20 is grounded, and the collector is connected to a load 22, shown diagrammatically for illustration purposes.

When the switch 12 is closed, the $V_{cc}$ voltage rises much faster than the $V_{jj}$ voltage. The Schottky-clamped transistor 20, therefore, receives its base biasing potential $V_{cc}$ much earlier than the I²L gate 14 receives its emitter biasing potential $V_{jj}$. The Schottky-clamped transistor 20 conducts as soon as its $V_{be}$ is exceeded by the $V_{cc}$ voltage. The output of the Schottky-clamped transistor 20 is thus quickly established in the low state.

As the $V_{jj}$ voltage rises, a voltage level will be reached on the emitter of the PNP transistor 16 such that the transistor 16 is forward biased into conduction. The transistor 16 in turn biases the NPN transistor 18 into conduction, pulling its commonly connected collectors to low, and also the Schottky-clamped transistor 20 base is pulled to low, turning off the transistor 20. The output of the Schottky-clamped transistor 20 then goes to high.

It is thus seen that the Schottky-clamped transistor 20 assumes a first state which is conducting, soon after a first bias voltage is established on its base from a first voltage supply $V_{cc}$. Then, at a later time, with no intervening logic signal applied, the Schottky-clamped transistor 20 automatically is changed to a second state, which is non-conducting, after a second bias voltage is established, not on the Schottky-clamped transistor 20 itself, but on an I²L gate 14 coupled to the Schottky-clamped transistor 20.

Figure 6:
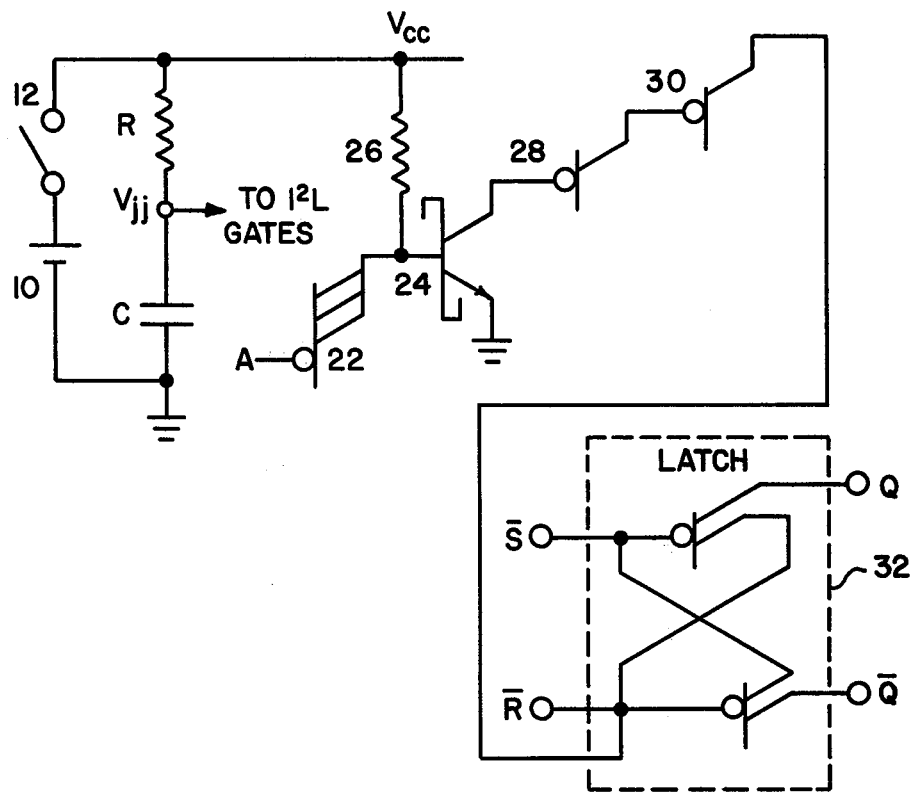
FIG. 6 is a schematic diagram from an I²L gate array incorporating a circuit according to the invention for setting a latch in a predetermined initial state.

FIG. 6 shows an embodiment of the invention in which a latch can be forced to come up in a known state. In FIG. 6 an input I²L gate 22 has its three collectors connected together and coupled to the base of a Schottky-clamped transistor 24. The base of the Schottky-clamped transistor 24 is biased through a resistor 26 from the voltage supply $V_{cc}$. The output collector of the Schottky-clamped transistor 24 is coupled to a buffer I²L gate 28 which in turn is coupled to an I²L output gate 30. The collector of the output gate 30 is connected to the reset input $\overline{R}$ of a latch 32. The I²L gates 22, 28, and 30 are shown in their simplified form, it being understood that they incorporate the elements and connections shown in FIG. 1 as above described.

The operation of the circuit of FIG. 6 is as follows. As soon as the $V_{cc}$ power is turned on by the switch 12, the Schottky-clamped transistor 24 will turn ON, establishing a low state on the collector of the Schottky-clamped transistor 24. At this point in time, the I²L gates 22, 28 and 30 are in the high impedance state, and as far as the latch circuit 32 is concerned, the input supplied thereto by the output gate 30 is in the high impedance state, which means it has no effect on the latch circuit 32. Now assuming the RC time constant is applied to the injector bar, in this case the emitter of the PNP transistor shown in FIG. 1, on the three gates 22, 28 and 30, at some point in time after $V_{cc}$ is applied the $V_{jj}$ bus line will reach a voltage high enough to activate gates 22, 28 and 30. Since the Schottky gate 24 was in the low state when this value $V_{jj}$ is reached, the gate 28 will go to the OFF state, where its collector will be in the high state, and the gate 30 will be held in the low state, so that at this point in time the gate 30 will cause the latch 32 to be reset. At the same point in time, input gate 22 now becomes activated, and its collector goes to the low state. When that occurs, Schottky-clamped transistor 24 turns OFF, transistor 28 turns ON, and output transistor 30 turns OFF. The turning OFF of output transistor 30 has no effect on the latch 32. However, since there is a propagation time delay between the activation of the gates 22 and 30, it will now require a propagation delay time from the time that the input gate 22 turns ON or goes to the low state until the output on the gate 30 will go to the high state, and this amount of time will be determined by the amount of propagation delay time experienced through a typical I²L gate.

It will be appreciated that after the two power supply voltages $V_{cc}$ and $V_{jj}$ have been established and the gate array is initially set, the power up and clear circuit thereafter has no affect on the operation of the gate array, and the latter can be utilized in its normal intended manner by applying logic input signals at internal terminals $\overline{R}$ or $\overline{S}$, for example, shown in FIG. 6.

Figure 7:
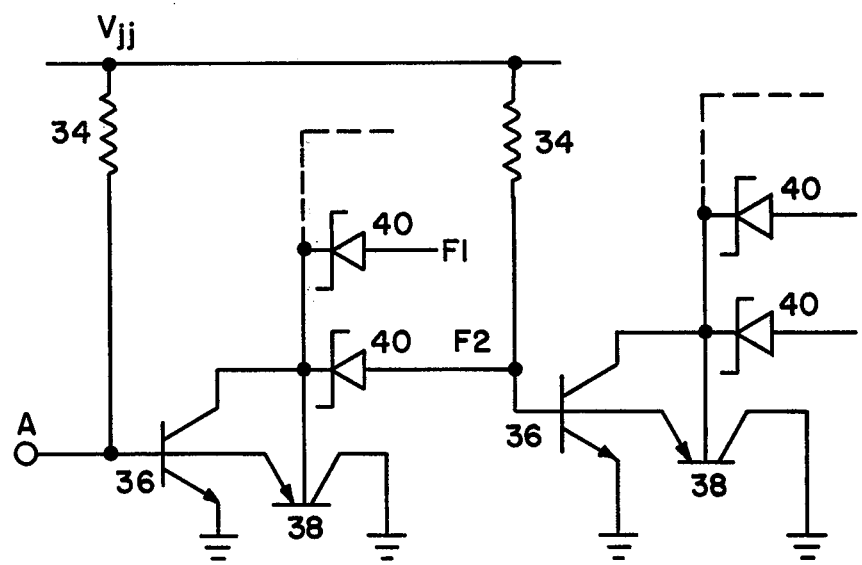
FIG. 7 is a schematic diagram showing a typical ISL gate that can be used in place of the I²L gates shown in FIG. 6.

The RC time delay circuit can be utilized with injected Schottky logic gates (ISL) used in place of the I²L gates. For example, FIG. 7 shows a suitable form from an ISL gate array that can be used. The $V_{jj}$ supply is fed through a bias supply resistor 34 to the base of an NPN transistor 36. The transistor 36 has a first emitter which is grounded and a second emitter which is coupled to the base of a PNP transistor 38, the collector of which is grounded and the base of which is connected to the collector of the NPN transistor 36 and to the cathodes of one or more Schottky diodes 40. The outputs of the Schottky diodes 40 are taken from the anodes thereof and are shown as providing outputs F1 and F2, for example. An input terminal A is shown connected to the base of the NPN transistor 36. It will be clear that the operation of the circuitry employing ISL gates will be similar to the operation of circuitry employing I²L gates, and no further explanation is required.

What is claimed is:

1. A power-on conditioning circuit for logic circuitry comprising:
    (a) a reference terminal and first and second power supply terminals for supplying two independent supply voltages of differing magnitude to logic circuitry when said first power supply terminal and said reference terminal are connected across a voltage source;
    (b) a capacitor connected between said reference terminal and said second power supply terminal;
    (c) a resistor connected between said first and second power supply terminals;
    (d) a first bipolar transistor gate operative at a first supply voltage and having an input electrode coupled to said second power supply terminal and having an output electrode;
    (e) a biasing element coupled between the output electrode of said first bipolar transistor gate and said first power supply terminal;
    (f) a second bipolar transistor gate operative at a second supply voltage of greater magnitude than said first supply voltage and having an input electrode coupled to said biasing element and to the output electrode of said first bipolar transistor gate and having an output electrode;

(g) said first and second bipolar transistor gates being so interconnected with said resistor and capacitor that said second gate receives its supply voltage and reaches its conducting state earlier in time than said first gate, said resistor and capacitor forming a charging circuit that delays the application of the full amount of the first supply voltage to said first gate until after said second gate reaches conducting state, thereby producing a delay time before said first gate conducts and causes said second gate to turn off; and (h) additional logic circuit means coupled to the output electrode of said second bipolar transistor gate for receiving an initial conditioning signal from said second gate when said second gate turns off.

2. The invention according to claim 1, wherein said first bipolar transistor gate comprises an I²L gate.

3. The invention according to claim 2, wherein said second bipolar transistor gate comprises a Schottky clamped transistor.

4. The invention according to claim 1, wherein said first bipolar transistor gate comprises an ISL gate.

5. The invention according to claim 4, wherein said second bipolar transistor gate comprises a Schottky clamped transistor.

6. The invention according to claim 1, wherein said second bipolar transistor gate comprises a Schottky clamped transistor.

7. The invention according to claim 1, wherein said logic circuit comprises a latch circuit which receives a signal from said second gate to place the latch circuit in a desired binary state.

* * * * *